United States Patent

Kitch et al.

[11] Patent Number: 6,103,629
[45] Date of Patent: Aug. 15, 2000

[54] SELF-ALIGNED INTERCONNECT USING HIGH SELECTIVITY METAL PILLARS AND A VIA EXCLUSION MASK

[75] Inventors: Vassili Kitch, San Ramon; Michael E. Thomas, Milpitas, both of Calif.

[73] Assignee: National Semiconductor Corporation, Santa Clara, Calif.

[21] Appl. No.: 09/295,898

[22] Filed: Apr. 21, 1999

Related U.S. Application Data

[63] Continuation-in-part of application No. 08/923,859, Sep. 3, 1997, Pat. No. 5,904,569.

[51] Int. Cl.[7] .................................................. H01L 21/00
[52] U.S. Cl. ........................ 438/692; 216/38; 216/88; 438/720; 438/740; 438/742
[58] Field of Search ................................. 438/631, 637, 438/645, 691, 692, 720, 738, 740, 742; 216/38, 18, 67, 75, 77, 78, 88, 89

[56] References Cited

U.S. PATENT DOCUMENTS

| | | | |
|---|---|---|---|
| 4,917,759 | 4/1990 | Fisher et al. | 156/643 |
| 5,258,096 | 11/1993 | Sandhu et al. | 156/643 |
| 5,451,543 | 9/1995 | Woo et al. | 437/195 |
| 5,858,879 | 1/1999 | Chao et al. | 438/740 |
| 6,004,884 | 12/1999 | Abraham | 438/742 X |

*Primary Examiner*—William Powell
*Attorney, Agent, or Firm*—Limbach & Limbach L.L.P.

[57] ABSTRACT

A process for forming a via in a semiconductor device using a self-aligned tungsten pillar to connect upper and lower conductive layers separated by a dielectric. A Ti/TiN layer is formed on an underlying substrate layer, an aluminum-copper layer is formed on the Ti/TiN layer, a TiN layer is formed on the aluminum-copper layer and a tungsten layer is formed on the TiN layer. In one continuous etching step, the stack of tungsten, TiN, Al—Cu, Ti/TiN is then patterned and etched. A first dielectric is deposited overlying the exposed regions of the substrate layer and the conductive stack. The wafer is then planarized to expose the top of the tungsten layer. The wafer is again patterned and the tungsten is etched using the titanium nitride as an etch stop. A second dielectric is deposited to fill the resulting gaps and CMP processes are used to planarize the wafer and expose the top of the tungsten pillar. An aluminum-copper layer is then formed on the overlying dielectric to make electrical contact to the exposed surface of the tungsten pillar. Since the etch of the upper aluminum-copper layer to form the upper interconnect pattern is highly selective to tungsten, the tungsten is not etched if there is misalignment of the upper metal mask.

16 Claims, 3 Drawing Sheets

SELF-ALIGNED INTERCONNECT USING HIGH SELECTIVITY METAL PILLARS AND A VIA EXCLUSION MASK

RELATED APPLICATIONS

This application is a Continuation-In-Part of and commonly-assigned application Ser. No. 08/923,859, filed Sep. 3, 1997, U.S. Pat. No. 5,904,569, titled METHOD FOR FORMING SELF-ALIGNED VIAS IN MULTI-LEVEL METAL INTEGRATED CIRCUITS.

TECHNICAL FIELD OF INVENTION

The present invention relates to fabrication of semiconductor integrated circuit structures. In particular, the invention relates to techniques for forming vias in multi-level metal integrated circuits using self-aligned metal pillars that are formed using a via exclusion mask and that exhibit high etch selectivity with respect to both the lower and upper metal interconnect layers.

DESCRIPTION OF RELATED ART

Integrated circuits commonly use multi-level metal interconnects to reduce the layout area required for the tens or hundreds of thousands of semiconductor elements that typically form an integrated circuit structure. This reduction in layout area is possible because the metal layers used in multi-level metal schemes are separated by dielectric material that allows crisscrossing of the separated metal layers without electrical shorting. Electrical connections between metal layers are created by forming small apertures in the dielectric material and filling the apertures with a conducting material, e.g. aluminum. These connections, usually made between consecutive metal layers, are known as "vias."

As semiconductor device geometries continue to shrink into the submicron range, it is increasingly difficult to maintain planar metal and dielectric surfaces during the formation of multi-level metal interconnect structures. This lack of planarity can cause several problems. For example, if the underlying topography coated by a photoresist layer contains abrupt steps, then the thickness of the photoresist layer will not be uniform. This can occur, for example, when the photoresist is applied over features formed earlier in a semiconductor device process that protrude from the surface of the structure. The resulting non-uniformity in the photoresist thickness can lead to some regions of the patterned photoresist layer being insufficiently thick to protect underlying features during a later etching step and to other regions being excessively thick so that the full thickness of the photoresist layer cannot be exposed due to the depth-of-focus limitations of photolithography at sub-micron dimensions. Also, poor planarity of metal and dielectric layers promotes poor metal step coverage which increases metal sheet-resistance, susceptibility to current-stress failure, electromigration problems and the probability of electrical opens. In addition, poor planarity in underlying metal or dielectric layers formed earlier in a semiconductor device process further increases the difficulty of establishing planarity in overlying metal or dielectric layers formed later in the process.

Another difficulty associated with via formation for multi-level metal interconnect structures in sub-micron architectures is the alignment of upper and lower metal layers with a via aperture formed in an intermediate dielectric. This alignment is difficult to achieve because of the small distance between device features in sub-micron devices and, thus, the reduced tolerance available for alignment errors. Misalignment of a via relative to connected upper and lower metal layers can lead to reduced device yield, increased via resistance and poor metal coverage in the via. For example, in a standard via, misalignment of the via relative to the lower metal layer results in overetching into the dielectric underlying the lower metal layer, thereby increasing the aspect ratio of the via opening and preventing adequate step coverage when the via is later filled with metal. The result is a poor contact interface in the via and increased via resistance. Misalignment of an upper metal layer relative to a via results in overetching, or notching, of the lower metal layer. The notched lower metal layer exhibits increased current density and is, thus, more susceptible to failure from electromigration or current stress.

In many semiconductor devices, the layout dimensions of upper and lower metal layers connecting to vias are extended in the vicinity of the via to form a layout frame, or head, around the via. This is known as "framing" the via. The frame provides additional alignment margin such that if partial misalignment of an upper and lower metal layer relative to the intended via location occurs, the actual formed via will still overlie a portion of a lower metal layer or underlie a portion of an upper metal layer. However, an adverse effect of using framed vias in a semiconductor device layout is that the packing density is substantially decreased (or the layout area is substantially increased).

A third difficulty associated with via formation for multi-level metal interconnects in sub-micron architectures is the contact resistance of the vias caused by polymer residue formation during the etching of the vias. These residues are typically formed during plasma etching and may contaminate the bottom of the via, causing a poor metallurgical contact between the lower metal layer and the metal in the via.

Accordingly, a need exists for a method of forming a via for connecting multi-level metal interconnects in sub-micron semiconductor device architectures that improves the surface planarity of formed metal and dielectric layers, reduces problems associated with via misalignment, reduces contact resistance problems associated with polymer residues, and lowers associated manufacturing costs.

SUMMARY OF THE INVENTION

The present invention provides a process for forming a via in a semiconductor device that uses a self-aligned metal pillar to connect conductive interconnect layers separated by a dielectric. The upper surface of the pillar comprises a conductive material that exhibits high selectivity, i.e. greater than 5:1, to the etch of the overlying metal interconnect structure.

In accordance with one embodiment of the invention, the lower interconnect layer includes a titanium/titanium nitride (Ti/TiN) layer, an aluminum-copper (Al—Cu) layer formed on the Ti/TiN layer, a TiN layer formed on the Al—Cu layer, and a PVD—or CVD-deposited tungsten (W) layer formed on the TiN layer. The four layers are then patterned using a conventional hardmask and etched to form the patterned lower interconnect layer. While use of a hardmask is preferred, either thick photoresist or the tungsten itself can be used as the mask to etch the underlying layers. If the tungsten is used, a resist mask is used to pattern the tungsten and the patterned tungsten is then used to etch through the remainder of the metal stack. Following definition of the metal stack, dielectric material is deposited, filling the gaps between the patterned portion of the lower interconnect layer. The structure is then planarized using chemical mechanical polishing (CMP), leaving the patterned portion of the tungsten exposed. The exposed tungsten is then masked and etched to define tungsten via pillars on the lower patterned metal layer (comprising TiN on Al-Cu on Ti/TiN). The TiN serves as an etch stop during definition of the tungsten pillars. The gaps between the tungsten pillars are then filled with dielectric material, which is then planarized to expose the upper surfaces of the tungsten pillars. An upper conductive layer is then formed in electrical contact with the exposed tungsten. Since the conductive layer formed on the tungsten is typically aluminum or another material having high selectivity to tungsten, etching of the conductive layer during its patterning will not etch the underlying tungsten in the event of misalignment.

A better understanding of the features and advantages of the present invention will be obtained by reference to the following detailed description and accompanying drawings which set forth an illustrative embodiment in which the principles of the invention are utilized.

DETAILED DESCRIPTION

FIGS. 1–5 illustrate a process for forming a self-aligned tungsten-capped metal stack for use as a via to connect upper and lower layers of metal interconnect in a semiconductor device using double-metal, in accordance with one embodiment of the invention.

Figure 1:
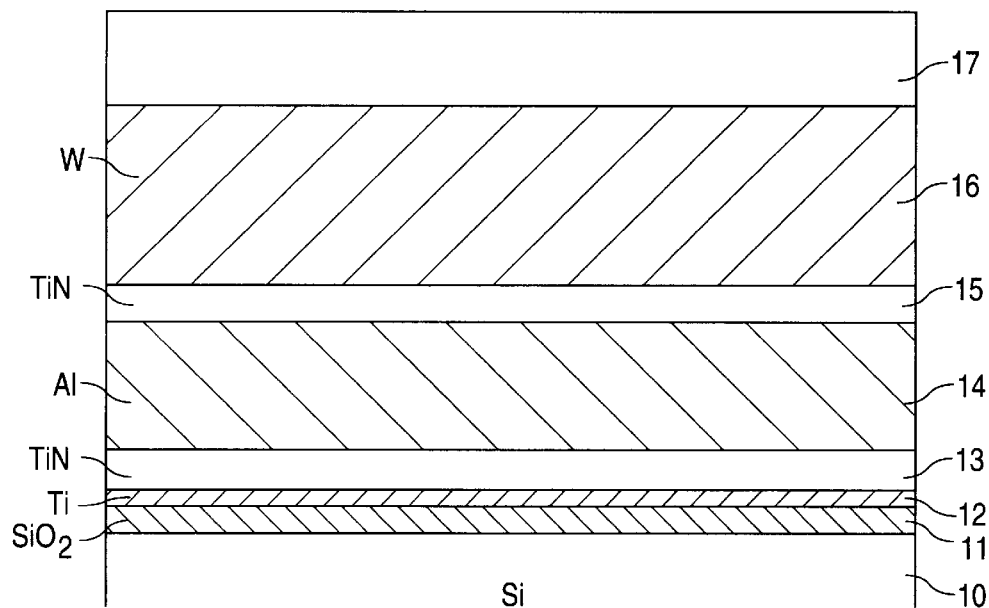
FIGS. 1–5 illustrate process steps of one embodiment of a method in accordance with the present invention.

In this process, as shown in FIG. 1, a first oxide layer 11 is deposited overlying a semiconductor substrate 10. A layer 12/13 of the titanium/titanium nitride (Ti/TiN) is deposited overlying the first oxide layer 11, followed by deposition of a layer 14 of aluminum-copper (Al—Cu) overlying the Ti/TiN layer 12/13 in a conventional physical vapor deposition (PVD) process. A second layer 15 of titanium nitride (TiN) is then deposited on the aluminum-copper layer 14. Finally, a layer 16 of tungsten (W) is deposited overlying the titanium nitride layer 15 and covered with a conventional hardmask 17 that is preferred for etching a thick metal stack (Those skilled in the art will appreciate that if a robust photoresist is used, then a hardmask is not needed.).

First oxide layer 11 is shown in FIG. 1 as formed overlaying a silicon substrate 10. Even though only first oxide layer 11 is shown formed overlying substrate 10, those skilled in the art will appreciate that it is possible for numerous structures such as field oxide regions, polysilicon regions, metal regions and active silicon device regions, or, for that matter, a via structure for connection to an underlying interconnect layer, to underlie first oxide layer 11. These underlying structures do not directly affect the practice of the invention because first oxide layer 11 is planarized using an etch back method, spin on glass (SOG), reflow, CMP or similar processing before forming overlying layers thereon. For example, first oxide layer 11 can be a deposited BPSG layer planarized by CMP or by an etch back, as is known to those skilled in the art.

Figure 2:
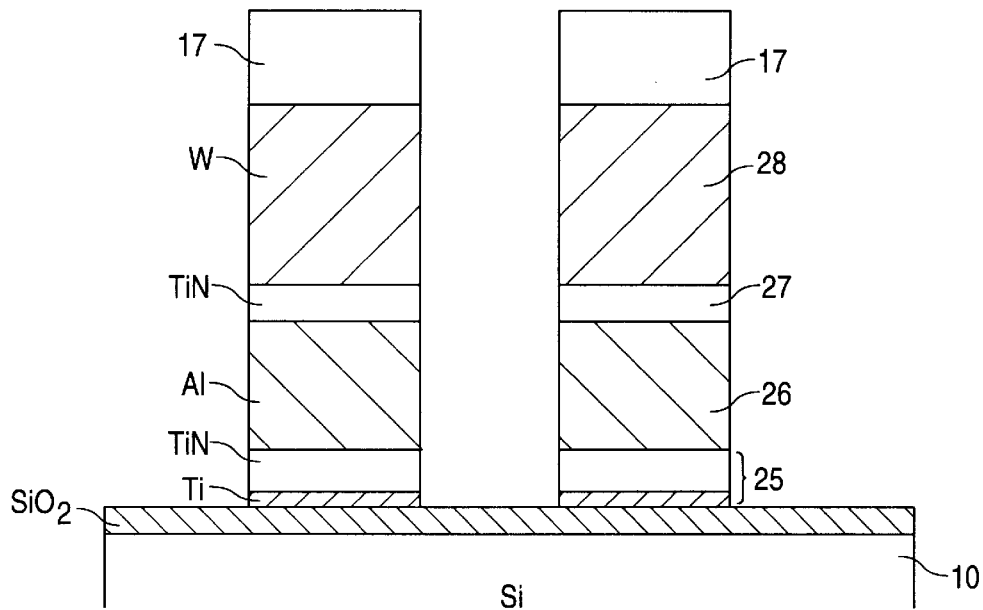

Referring to FIG. 2, in a preferred embodiment, a photoresist is used to generate a pattern in the hardmask 17, which is then used to etch the tungsten layer 16, the TiN layer 15, the aluminum-copper layer 14, and the Ti/TiN layer 12/13, thus leaving a Ti/TiN portion 25, an aluminum-copper portion 26, a TiN portion 27 and a tungsten cap 28 as desired for the lower level of metal interconnect.

It is noted that other well-known material combinations may be utilized in forming the lower interconnect stack so long as, in accordance with the concepts of the invention, the material underlying the upper conductive cap is selective to the etch of the upper cap material and the upper cap material is selective to the etch of the upper interconnect material. For example, copper could replace the Al—Cu/TiN layers in the above-described embodiment of the invention.

Figure 3:
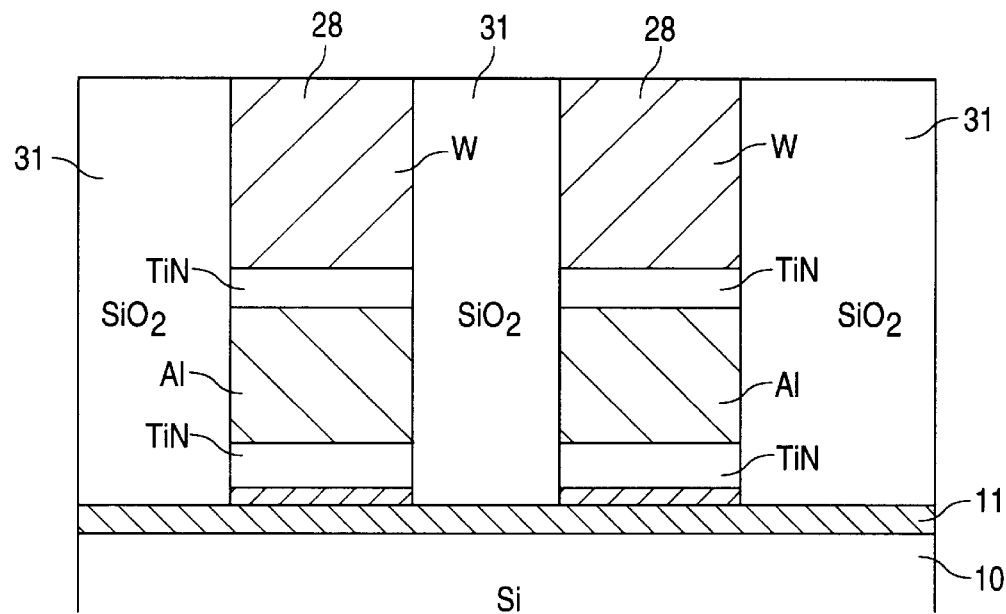

Next, as shown in FIG. 3, a second layer 31 of silicon oxide is deposited, using High Density Plasma (HDP) oxide deposition or spin on glass (SOG), overlying the exposed first oxide layer 11 and filling the gaps between the patterned lower metal interconnect structure. Those skilled in the art will appreciate that dielectrics other than HDP silicon dioxide, either organic or inorganic can be utilized, and applied in different, well-known ways (e.g. spin-on). The wafer is then planarized using a Chemical Mechanical Processes (CMP) to expose the top of the tungsten portion 28 of the metal stack, as shown in FIG. 3.

Figure 4:
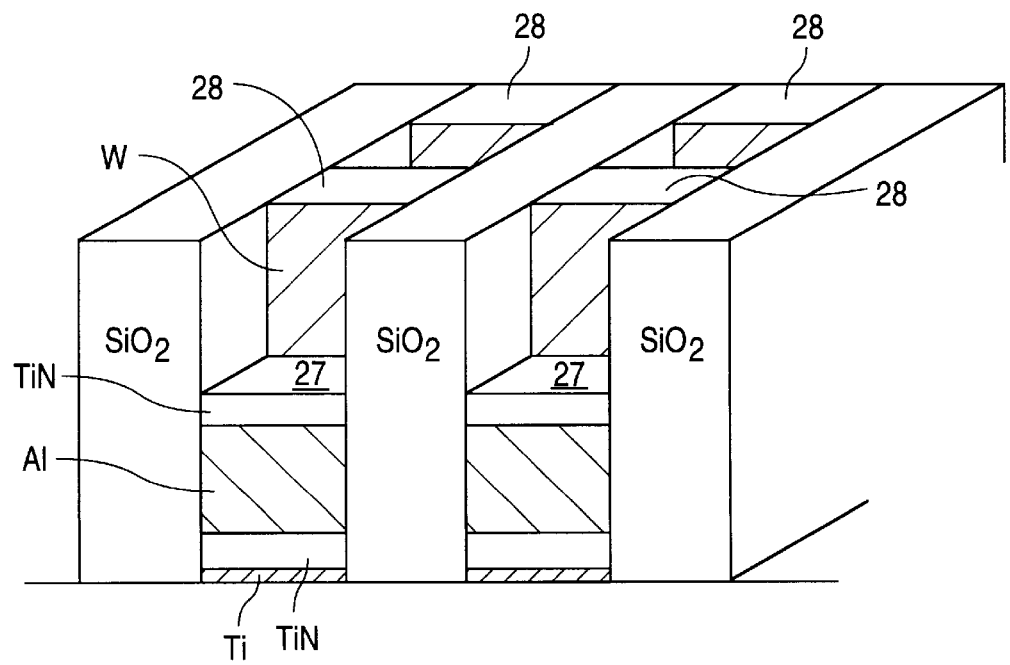

Referring to FIG. 4, the tungsten portion 28 of the lower metal interconnect structure is then patterned using a via exclusion mask (not shown) and etched to form tungsten pillars, using the underlying titanium nitride portion 27 as an etch stop.

Figure 5:
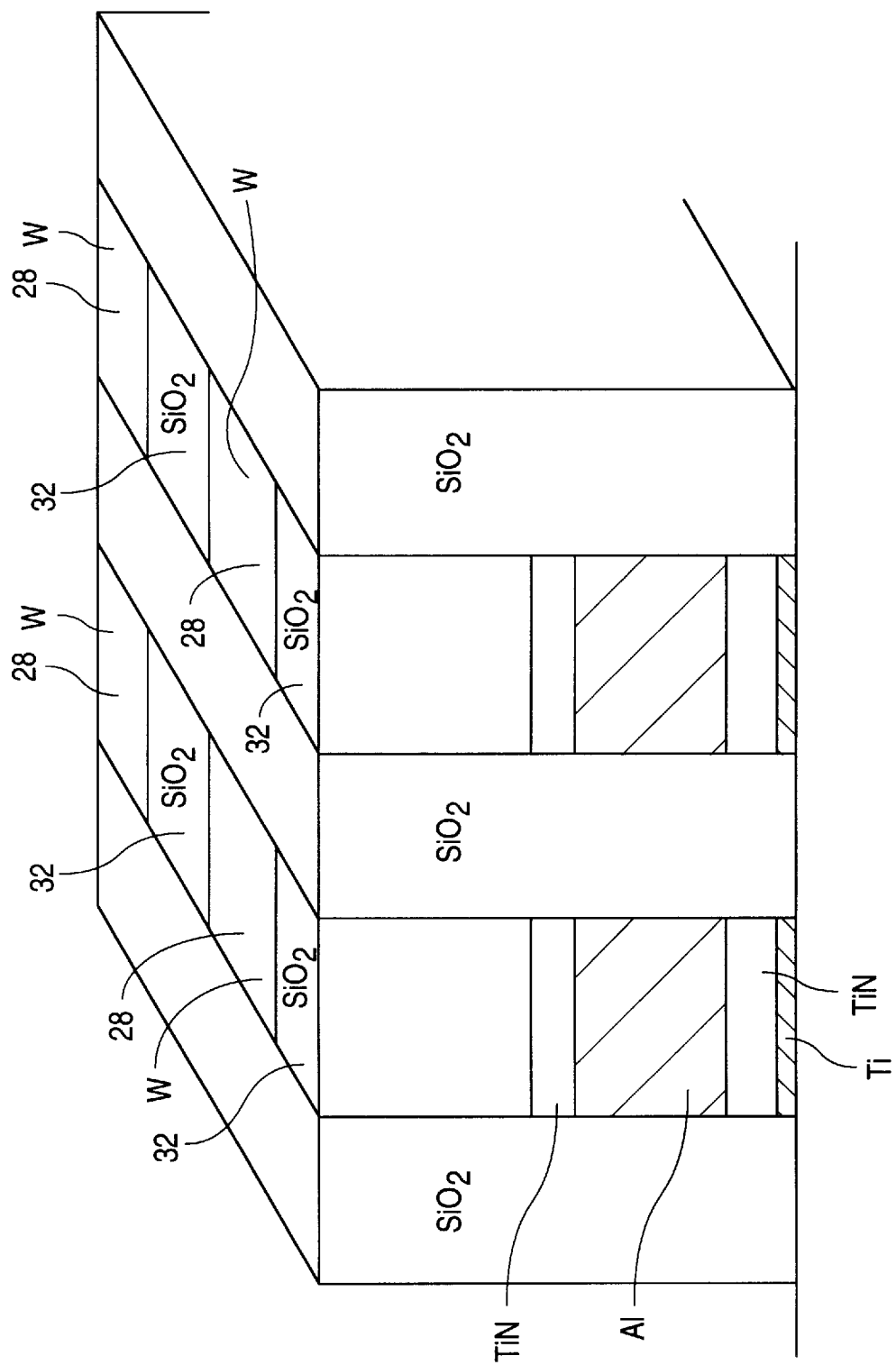

A third layer 32 of oxide is deposited overlying the wafer and filling the gaps created by the tungsten etch. The wafer is then planarized using CMP, thereby exposing the top of the tungsten pillars 28, as shown in FIG. 5.

A third upper layer of aluminum (not shown) is then deposited overlaying the second oxide layer 31 and the third oxide layer 32 and patterned to contact the top surface of the tungsten pillar 28, thus connecting two levels of metal interconnect in a semiconductor device with the tungsten pillars serving as the vias between the metal levels. In accordance with the invention, the aluminum etch chemistry is chosen from a menu of well known aluminum etch chemistries such that the etch is highly selective to tungsten, thereby preventing etch of the tungsten during the patterning of the upper interconnect in the event of misalignment of the upper interconnect mask.

Various other modifications and alterations in the structure and method of fabrication of this invention will be apparent to those skilled in the art without departing from the scope and spirit of the invention. Although the invention has been described in connection with specific preferred embodiments, it should be understood that the invention as claimed should not be unduly limited to such specific embodiments. It is intended that the following claims define the scope of the invention and that structures and methods within the scope of these claims and their equivalents be covered thereby.

What is claimed is:

1. A method of forming a conductive via pillar on a lower interconnect layer in a semiconductor device structure, the method comprising:

forming a lower conductive layer on an underlying layer as part of the semiconductor device structure;

forming a layer of conductive via pillar material on the lower conductive layer;

etching the layer of conductive via pillar material and the lower conductive layer to define a patterned conductive stack and to expose portions of the underlying layer;

filling gaps between the patterned conductive stack with first dielectric material;

planarizing the first dielectric material to expose upper surfaces of the patterned layer of via pillar material;

etching selected portions of the patterned layer of via pillar material, the patterned lower conductive layer serving as an etch stop, thereby defining spaced-apart via pillars of via pillar material on the lower conductive layer;

filling gaps between the via pillars with second dielectric material; and planarizing the second dielectric material to expose upper surfaces of the pillars.

2. A method as in claim 1, and wherein the lower conductive layer comprises a plurality of layers of conductive material such that at least one conductive material is different from another one of said conductive materials.

3. A method as in claim 1, and wherein the lower conductive layer comprises:

a layer of Ti/TiN formed on the underlying layer;

a layer of aluminum-containing material formed on the Ti/TiN layer; and a layer of TiN formed on the layer of aluminum-containing material.

4. A method as in claim 3, and wherein the via pillar material comprises tungsten.

5. A method as in claim 4, and wherein the first dielectric material comprises silicon oxide.

6. A method as in claim 5, and wherein the second dielectric material comprises silicon oxide.

7. The method of claim 1, and wherein the step of forming the lower conductive layer comprises forming a sequence of layers of materials selected from the group consisting of aluminum, tungsten, titanium, titanium nitride, tantalum, tantalum nitride, and combinations thereof.

8. A method of forming conductive via pillars between a lower interconnect layer and an upper interconnect layer in a semiconductor device structure, the method comprising:

forming the lower conductive layer on an underlying layer as part of the semiconductor device structure;

forming a layer of conductive via pillar material over the lower conductive layer;

etching the layer of conductive via pillar material and the lower conductive layer to define a patterned conductive stack and to expose portions of the underlying layer;

filling gaps between the patterned conductive stack with first dielectric material;

planarizing the first dielectric material to expose upper surfaces of the patterned layer of via pillar material;

etching selected portions of the patterned layer of via material, the patterned lower conductive layer serving as an etch stop, thereby defining spaced-apart via pillars of via pillar material on the lower conductive layer;

filling gaps between the via pillars with second dielectric material;

planarizing the second dielectric material to expose top surfaces of the via pillars; and forming the upper interconnect layer overlying the exposed top surfaces of the via pillars such that the via pillars form vias between the patterned lower conductive layer and the upper interconnect layer.

9. A method as in claim 8, and wherein the lower conductive layer includes a layer of Ti/TiN formed on the underlying layer;

a layer of aluminum-containing material formed on the Ti/TiN layer; and a layer of TiN formed on the layer of aluminum-containing material.

10. A method as in claim 8, and wherein the aluminum-containing material is aluminum-copper.

11. A method as in claim 8, and wherein the via pillar material comprises tungsten.

12. A method of forming conductive via pillars between an upper interconnect layer and a lower interconnect layer in a semiconductor device structure, the method comprising:

forming a layer of Ti/TiN on an underlying substrate layer as part of the semiconductor device structure;

forming a layer of aluminum-copper overlying the Ti/TiN layer;

forming a layer of a TiN overlying the aluminum-copper layer such that the Ti/TiN, aluminum-copper and TiN layers define a lower conductive layer;

forming a layer of tungsten overlying the TiN layer;

etching the tungsten, TiN, aluminum-copper, and Ti/TiN layers to form a patterned metal stack and to expose the substrate layer;

depositing a layer of first dielectric material such that the first dielectric material fills gaps between the patterned metal stack;

planarizing the first dielectric material to expose a top surface of the patterned tungsten layer;

etching selected portions of the tungsten layer, using the TiN layer as an etch stop, to form spaced-apart tungsten via pillars on the TiN layer;

depositing a layer of second dielectric material such that the second dielectric layer fills gaps between the tungsten via pillars;

planarizing the second dielectric material to expose top surfaces of the tungsten via pillars; and forming the upper interconnect layer overlying the exposed tops of the tungsten via pillars.

13. The method of claim 12, and wherein the step of forming the upper interconnect layer comprises forming a sequence of layers of materials selected from the group consisting of aluminum, tungsten, titanium, titanium nitride, tantalum, tantalum nitride, and combinations thereof.

14. The method of claim 12, and wherein the step of etching the tungsten layer comprises etching anisotropically.

15. The method of claim 12, and wherein the step of depositing a layer of first dielectric material comprises depositing a layer of material selected from the group consisting of High Density Plasma (HDP) oxide and Spin On Glass (SOG).

16. The method of claim 12, and wherein the planarizing step comprises Chemical Mechanical Polishing (CMP).

* * * * *